(12) United States Patent
Asada et al.

(10) Patent No.: US 10,331,029 B2
(45) Date of Patent: Jun. 25, 2019

(54) IMPRINT APPARATUS, METHOD OF MANUFACTURING ARTICLE, AND SUPPLY APPARATUS

(71) Applicant: CANON KABUSHIKI KAISHA, Tokyo (JP)

(72) Inventors: Kunihiko Asada, Utsunomiya (JP); Tsuyoshi Arai, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 178 days.

(21) Appl. No.: 15/230,766

(22) Filed: Aug. 8, 2016

(65) Prior Publication Data

US 2017/0068160 A1 Mar. 9, 2017

(30) Foreign Application Priority Data

Sep. 3, 2015 (JP) .................. 2015-174017

(51) Int. Cl.
*B29C 70/78* (2006.01)
*H01L 21/027* (2006.01)
*G03F 7/00* (2006.01)

(52) U.S. Cl.
CPC .................. *G03F 7/0002* (2013.01)

(58) Field of Classification Search
CPC ........ B29C 59/00; B29C 59/02; G03F 7/0002
See application file for complete search history.

(56) References Cited

U.S. PATENT DOCUMENTS

| 8,394,203 | B2 | 3/2013 | Schmid et al. |
| 8,822,128 | B2 | 9/2014 | Iwabuchi et al. |
| 8,917,380 | B2 | 12/2014 | Loopstra et al. |
| 9,165,797 | B2 | 10/2015 | Yoshihara et al. |
| 2010/0101493 | A1 | 4/2010 | Hodge et al. |
| 2010/0102471 | A1* | 4/2010 | Truskett ................. B82Y 10/00 264/40.7 |

(Continued)

FOREIGN PATENT DOCUMENTS

| CN | 102171611 A | 8/2011 |
| CN | 102736442 B | 2/2015 |

(Continued)

OTHER PUBLICATIONS

Office Action issued in Taiwanese Appln. No. 105125456 dated May 14, 2018. English translation provided.

(Continued)

*Primary Examiner* — Nahida Sultana
(74) *Attorney, Agent, or Firm* — Rossi, Kimms & McDowell LLP

(57) ABSTRACT

The present invention provides an imprint apparatus including a chamber configured to define a first space including a processing unit which includes a discharge unit configured to discharge an imprint material onto a substrate and is configured to perform an imprint process of forming a pattern of the imprint material on the substrate by using a mold, and an enclosure configured to define a second space including a tank configured to store the imprint material supplied to the discharge unit, wherein the tank has a first opening open to the second space, and the enclosure has a supply port configured to supply, to the second space via the first opening, a gas cleaner than a gas supplied to the first space.

9 Claims, 3 Drawing Sheets

(56) References Cited

U.S. PATENT DOCUMENTS

| | | | |
|---|---|---|---|
| 2011/0287124 A1* | 11/2011 | Chuang | B29C 35/007 |
| | | | 425/385 |
| 2012/0228789 A1* | 9/2012 | Wakabayashi | B29C 59/02 |
| | | | 264/39 |
| 2013/0093113 A1* | 4/2013 | Hayashi | G03F 7/0002 |
| | | | 264/40.1 |
| 2014/0239529 A1* | 8/2014 | Tan | G03F 7/0002 |
| | | | 264/40.5 |
| 2015/0097900 A1* | 4/2015 | Araki | B29C 59/16 |
| | | | 347/85 |
| 2015/0158242 A1* | 6/2015 | Iwasaki | G03F 7/0002 |
| | | | 425/174.4 |
| 2015/0190961 A1* | 7/2015 | Nakagawa | G03F 7/0002 |
| | | | 264/40.5 |
| 2016/0039126 A1* | 2/2016 | Tan | G03F 7/0002 |
| | | | 264/40.5 |
| 2016/0366769 A1 | 12/2016 | Honma et al. | |
| 2018/0079214 A1* | 3/2018 | Tone | B41J 2/16532 |
| 2018/0339437 A1* | 11/2018 | Patterson | B29C 43/222 |
| 2018/0364596 A1* | 12/2018 | Chang | G03F 7/70841 |

FOREIGN PATENT DOCUMENTS

| | | |
|---|---|---|
| JP | 2012049471 A | 3/2012 |
| JP | 2013092643 A | 5/2013 |
| JP | 2013153063 A | 8/2013 |
| TW | 201022133 A1 | 6/2010 |
| TW | 201323184 A1 | 6/2013 |
| TW | 201533533 A | 9/2015 |
| WO | 2014145360 A1 | 9/2014 |

OTHER PUBLICATIONS

Office Action issued in Korean Appln. No. 10-2016-0110413 dated Jan. 23, 2019.

Office Action issued in Japanese Application No. 2015-174017 dated May 14, 2019.

* cited by examiner

IMPRINT APPARATUS, METHOD OF MANUFACTURING ARTICLE, AND SUPPLY APPARATUS

BACKGROUND OF THE INVENTION

Field of the Invention

The present invention relates to an imprint apparatus, a method of manufacturing an article, and a supply apparatus.

Description of the Related Art

As demands for micropatterning semiconductor devices increase, a microfabrication technique of molding an uncured imprint material (resin material) on a substrate with a mold and forming a pattern of the imprint material on the substrate is attracting attention, in addition to the conventional photolithography technique. This technique is also called an imprint technique and can form a fine structure of several nm order on the substrate.

A photo-curing method is one example of the imprint technique. In an imprint apparatus which adopts the photo-curing method, first, an imprint material is supplied (applied) to a shot region (imprint region) on a substrate. Then, an uncured imprint material on the substrate is cured by irradiating it with light in a state in which the imprint material and a mold are in contact with each other, and the mold is released from the cured imprint material, thereby forming a pattern on the substrate.

A supply apparatus used when supplying an imprint material onto a substrate generally includes a tank which stores the imprint material, a discharge unit (dispenser) which discharges the imprint material, and a supply pipe which supplies the imprint material from the tank to the discharge unit. The imprint material may be contaminated by a foreign substance or a metal in a process using the imprint material. If the contaminated imprint material is used, a defective pattern is formed on the substrate, affecting a yield. To cope with this, Japanese Patent Laid-Open No. 2013-92643 proposes a technique of removing a contaminant in an imprint material with a filter. Further, Japanese Patent Laid-Open No. 2013-153063 proposes a technique of separating a contaminant in an imprint material by evaporating the imprint material once.

In this related art, however, it is impossible to prevent the contamination itself of an imprint material while it is possible to deal with an imprint material that has already been contaminated. A component of an imprint material may change by a process such as filtering or evaporation. In this case, replacement of the imprint material itself is unavoidable. It is extremely difficult to remove all contaminants that have entered an imprint material. It is difficult to supply the imprint material stably and ensure a yield unless the contamination itself of the imprint material can be prevented.

In the supply apparatus which supplies the imprint material onto the substrate, the supply pipe connects the tank which stores the imprint material and the discharge unit which discharges the imprint material, and the imprint material is discharged from the discharge unit via the supply pipe. Inside the tank, the amount of the imprint material changes by discharging the imprint material, causing a pressure fluctuation. In order to cope with the pressure fluctuation, the tank has a communication port which communicates with the exterior of the tank. If a pressure inside the tank is set at a negative pressure with respect to a pressure outside the tank, a gas outside the tank may be absorbed. As a result, particles, a metal contained in moisture, or the like present outside the tank enters inside the tank and melts into the imprint material. That is, the imprint material stored in the tank may be contaminated.

SUMMARY OF THE INVENTION

The present invention provides an imprint apparatus advantageous in preventing or reducing the contamination of an imprint material.

According to one aspect of the present invention, there is provided an imprint apparatus including a chamber configured to define a first space including a processing unit which includes a discharge unit configured to discharge an imprint material onto a substrate and is configured to perform an imprint process of forming a pattern of the imprint material on the substrate by using a mold, and an enclosure configured to define a second space including a tank configured to store the imprint material supplied to the discharge unit, wherein the tank has a first opening open to the second space, and the enclosure has a supply port configured to supply, to the second space via the first opening, a gas cleaner than a gas supplied to the first space.

Further aspects of the present invention will become apparent from the following description of exemplary embodiments with reference to the attached drawings.

DESCRIPTION OF THE EMBODIMENTS

Figure 1:
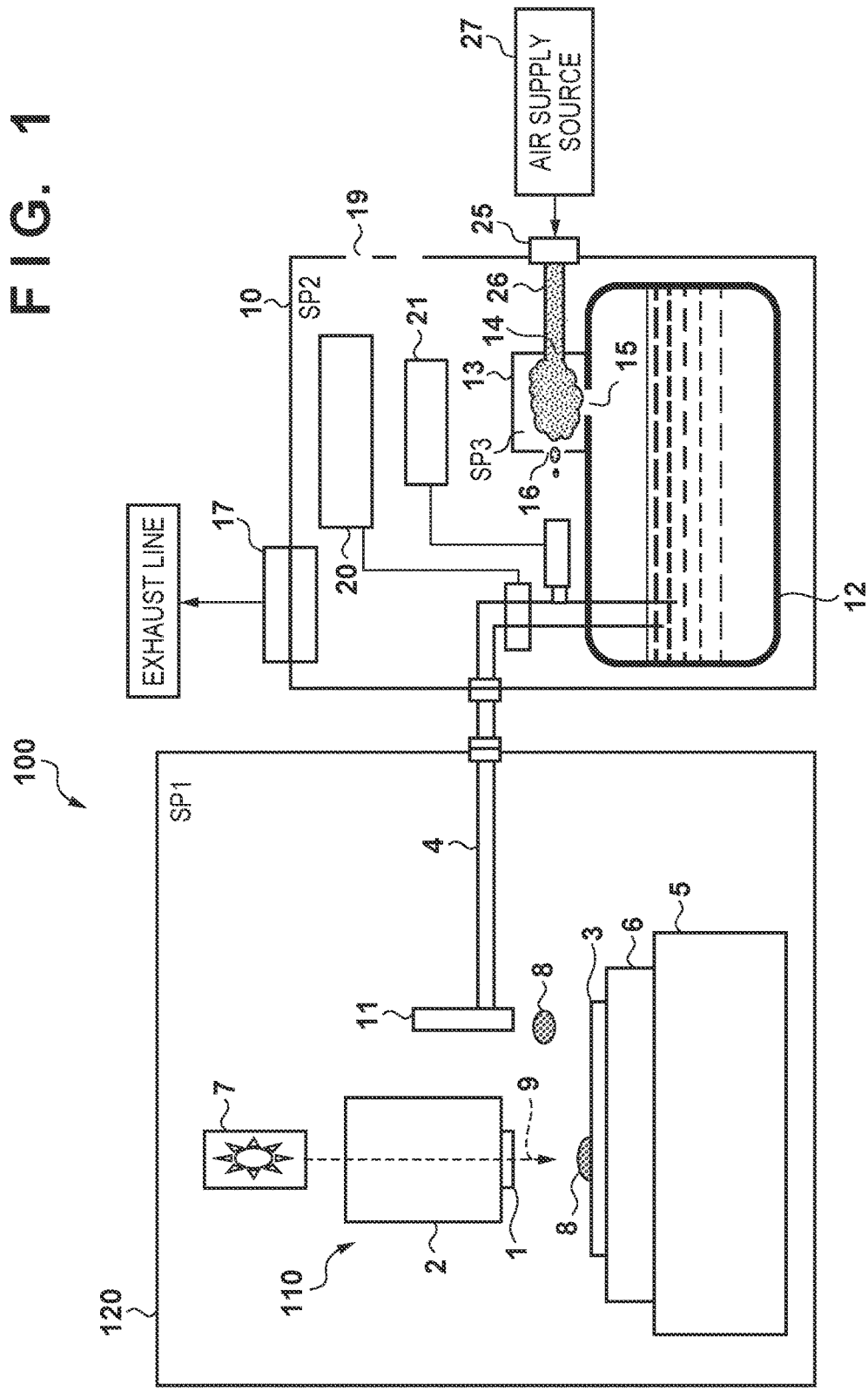
FIG. 1 is a schematic view showing the arrangement of an imprint apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an imprint apparatus 100 according to an aspect of the present invention. The imprint apparatus 100 is a lithography apparatus which forms a pattern on a substrate by curing an imprint material on the substrate in a state in which a mold and the imprint material are in contact with each other, and releasing the mold from the cured imprint material.

Glass, ceramics, a metal, a semiconductor, a resin, or the like is used for the substrate. A member made of a material different from that of the substrate may be formed on the surface of the substrate, as needed. More specifically, a silicon wafer, a compound semiconductor wafer, silica glass, or the like is used as the substrate.

A curable composition (may be referred to as an uncured resin) which is cured by receiving curing energy is used for the imprint material. An electromagnetic wave, heat, or the like is used as the curing energy. For example, light such as infrared light, visible rays, ultraviolet light, or the like whose wavelength is selected from a range of 10 nm (inclusive) to 1 mm (inclusive) is used as the electromagnetic wave. The curable composition is a composition that is cured by light irradiation or application of heat. Out of this, a photo-curable composition that is cured by light contains at least a polymerizable compound and a photopolymerization initiator, and may contain a non-polymerizable compound or solvent as needed. The non-polymerizable compound is at least a material selected from the group consisting of a sensitizer, a hydrogen donor, an internal mold release agent, a surfactant, an antioxidant, a polymer component, and the like. The viscosity (viscosity at 25° C.) of the imprint material is set at, for example, 1 mPa·s (inclusive) to 100 mPa·s (inclusive).

In this embodiment, an ultraviolet-curing resin material is used as the imprint material. The imprint apparatus 100 includes a processing unit 110 which performs an imprint process of forming a pattern in an imprint material 8 on the substrate by using a mold 1 and a chamber 120 which defines a first space SP1 defining the processing unit 110. The imprint apparatus 100 also includes a tank 12 which stores the imprint material 8 to be supplied to a dispenser (discharge unit) 11 and an enclosure 10 which defines a second space SP2 including the tank 12.

The processing unit 110 includes a driving unit 2 which drives the mold 1 upward and downward while holding it, a stage base 5, a substrate stage 6, an irradiation unit 7, and the dispenser 11 which discharges the imprint material 8 onto the substrate.

A fine three-dimensional pattern is formed on the mold 1. A pattern corresponding to the pattern of the mold 1 can be formed on the substrate. The driving unit 2 is held by a structure, and brings the mold 1 and the imprint material 8 on the substrate into contact with each other by moving the mold 1 closer to a substrate 3 or releases the mold 1 from the imprint material 8 on the substrate by moving the mold 1 away from the substrate 3. The substrate stage 6 can move on the stage base 5 while holding the substrate 3.

The irradiation unit 7 is arranged above the mold 1 and irradiates the imprint material 8 on the substrate with ultraviolet light 9 via the mold 1. The irradiation unit 7 includes a light source such as a mercury lamp which emits the ultraviolet light 9 (for example, an i-line or a g-line) and an optical system which condenses and shapes the ultraviolet light 9 emitted from the light source.

The imprint process by the processing unit 110 will be described. In the imprint process, first, the substrate stage 6 is caused to hold the substrate 3 and is moved such that the substrate 3 is positioned under the dispenser 11. Then, while moving the substrate stage 6, a predetermined amount of the imprint material 8 is discharged from the dispenser 11, and the imprint material 8 is supplied (applied) to a predetermined position (for example, a shot region) on the substrate. The imprint material 8 having a droplet-like shape, or an island-like shape or a film-like shape formed by a plurality of droplets connected to each other may be given on the substrate.

Then, the substrate stage 6 is moved such that the imprint material 8 supplied onto the substrate is positioned under the mold 1. Then, the driving unit 2 moves the mold 1 downward to bring the mold 1 and the substrate 3 closer to each other. An alignment scope (not shown) detects an alignment mark provided on the mold 1 and an alignment mark provided on the substrate 3, and the relative positions of them are adjusted.

Then, the driving unit 2 further moves the mold 1 downward to bring the mold 1 and the imprint material 8 on the substrate into contact with each other. In a state in which the mold 1 and the imprint material 8 on the substrate are in contact with each other, the imprint material 8 on the substrate is irradiated with the ultraviolet light 9 from the irradiation unit 7 via the mold 1, curing the imprint material 8. Then, the driving unit 2 moves the mold 1 upward and releases the mold 1 from the cured imprint material 8 on the substrate. Consequently, the pattern is formed on the substrate, and the imprint process is terminated.

The tank 12 which stores the imprint material 8 to be supplied to the dispenser 11 and the enclosure 10 which accommodates the tank 12 will be described. The enclosure 10 accommodates not only the tank 12 but also a pump 21 configured to circulate the imprint material 8, an adjustment unit 20 which adjusts (manages) the temperature of the imprint material 8, and the like. In this embodiment, the enclosure 10 is independently arranged outside the chamber 120 which accommodates the processing unit 110. A supply pipe 4 which penetrates the enclosure 10 and the chamber 120, and connects the dispenser 11 and the tank 12 is also provided. The imprint material 8 stored in the tank 12 is supplied to the dispenser 11 via the supply pipe 4.

The imprint material 8 stored in the tank 12 is a liquid and generally contains a chemical substance toxic to a human body. Therefore, the enclosure 10 has an exhaust port 17 for exhausting a gas inside the enclosure 10, that is, in the second space SP2 outside (a space other than the first space and the second space), and is directly connected to an exhaust line in a factory or the like via the exhaust port 17. Considering safety, the exhaust line performs exhaustion of a larger amount than usual relative to the size of the enclosure 10. Therefore, the exhaust line has an exhaust arrangement different from that of an air circulation system or an exhaust system of the chamber 120 which accommodates the processing unit 110. Since the exhaust line keeps exhausting the gas in the second space SP2, an intake port 19 which takes an external gas in the second space SP2 is provided in the enclosure 10. For example, air in the imprint apparatus 100, and more specifically, a clean room where the chamber 120 and the enclosure 10 are arranged is taken in the second space SP2 via the intake port 19.

The pump 21 functions as a circulation unit which circulates the imprint material 8 stored in the tank 12 via the supply pipe 4 between the dispenser 11 and the tank 12. A pressure inside the dispenser 11 and the supply pipe 4 needs to be set at a negative pressure with respect to an atmospheric pressure so as not to leak the imprint material 8 from the dispenser 11. Therefore, the pump 21 also functions as, for example, a pressure control unit which maintains the pressure inside the dispenser 11 and the supply pipe 4 at the negative pressure with respect to the atmospheric pressure by adjusting the supply amount of the imprint material 8 to be supplied to the dispenser 11 and the flow rate of the imprint material 8 flowing through the supply pipe 4. When the imprint material 8 is discharged from the dispenser 11, the predetermined amount of the imprint material 8 is discharged by applying a pressure by using a piezoelectric element or the like provided in the dispenser 11.

If a pressure is applied to the supply pipe 4, the dispenser 11, and the tank 12, it becomes impossible to maintain the pressure inside them at the negative pressure. Consequently, the imprint material 8 leaks from the dispenser 11 as described above, causing a chemical contamination or the like in the apparatus. Therefore, a path where the imprint material 8 exists needs to be maintained at a predetermined negative pressure and has a structure in which that pressure is never fluctuated except for normal control (for example, supply of the imprint material 8 to the dispenser 11 or the like).

In the tank 12, the liquid surface of the imprint material 8 stored in the tank 12 changes by consumption of the imprint material 8, maintenance (a process involving pressurization) for eliminating clogging of the dispenser 11, or the like. In order to avoid a pressure fluctuation inside the tank 12 caused by such a change in the liquid surface of the imprint material, a first opening 15 open to the outside of the tank 12, that is, the second space SP2 is provided in the tank 12.

The imprint apparatus 100 is arranged in the clean room, as described above. The clean room includes an equipment (not shown) configured to maintain the interior of the room at a predetermined level of cleanliness. For example, air having passed through a filter is supplied to the clean room while generating a predetermined flow (down flow) flowing downward and further, air supplied with dust and particles generated in the clean room is recovered (dust removed) on a floor surface side. This is similarly performed in the first space SP1 and the second space SP2 as well. However, it is extremely difficult, in terms of a cost and maintenance, to provide a filter capable of removing a contaminant in an amount causing a problem for the imprint material 8 to form a fine pattern on the substrate in an air conditioning equipment in each of the clean room, the first space SP1, and the second space SP2. Hence, the gas present in the clean room often contains a contaminant in an amount that changes a component of the imprint material 8 though it maintains the predetermined level of cleanliness.

To cope with this, this embodiment has an arrangement in which the proximity of the first opening 15 of the tank 12 is covered with a cover member 13, and clean dry air is supplied to its interior. Note that the clean dry air is a gas cleaner than a gas caused to pass through the filter to be supplied to the clean room, the first space SP1 and the second space SP2. Note that a clean gas contains an organic gas and an inorganic material (NH$_4$, SOx, or the like) in small amounts per unit volume, both of which are likely to contaminate the imprint material 8.

More specifically, the enclosure 10 has a supply port 25 for supplying the clean dry air to the second space SP2 and is connected, via the supply port 25, to an air supply source 27 which supplies the clean dry air. The cover member 13 is provided on the tank 12 and defines a third space SP3 separated from the second space SP2 while covering the first opening 15. The cover member 13 has a connection port 14 and a second opening 16 open to the second space SP2. An introduction pipe (first pipe) 26 for introducing the clean dry air connects the supply port 25 of the enclosure 10 and the connection port 14 of the cover member 13. The introduction pipe 26 has one end connected to the supply port 25 of the enclosure 10 and the other end connected to the connection port 14 of the cover member 13. The clean dry air is supplied to the third space SP3 via the introduction pipe 26. The clean dry air supplied to the third space SP3 is exhausted to the second space SP2 via the second opening 16 of the cover member 13.

In order to cope with the pressure fluctuation inside the tank 12, a pressure of the third space SP3 needs to be higher, by about several Pa, than the pressure inside the tank 12 and a pressure outside the tank 12, that is, the pressure of the second space SP2. Accordingly, the flow rate of the clean dry air supplied from the air supply source 27 is adjusted such that the pressure of the third space SP3 becomes higher than the pressure inside the tank 12. Based on the flow rate of the clean dry air supplied from the air supply source 27, a bore of the second opening 16 and a bore the connection port 14 of the cover member 13 is set such that the pressure of the third space SP3 becomes higher than the pressure inside the tank 12.

The clean dry air supplied from the air supply source 27 to the inside of the cover member 13, that is, the third space SP3 is exhausted via the second opening 16 if there is no pressure fluctuation inside the tank 12. Thus, the clean dry air continues to be supplied to the third space SP3 while maintaining its pressure constant.

On the other hand, in the above-described imprint process, if the imprint material 8 stored in the tank 12 is consumed, changing the liquid surface of the imprint material 8, the pressure fluctuation occurs inside the tank 12, and the gas is absorbed from the first opening 15 of the tank 12 to the inside of the tank 12. Note that the gas absorbed inside the tank 12 is the clean dry air supplied to the third space SP3 because the clean dry air is supplied from the air supply source 27 to the third space SP3 as described above. Therefore, the clean dry air enters inside the tank 12 even if the pressure fluctuation occurs inside the tank 12. This makes it possible to reduce the entry of the contaminant from outside the tank 12 and prevent or reduce the contamination of the imprint material 8 stored in the tank 12.

When the imprint apparatus 100 undergoes maintenance, the imprint material 8 present in the supply pipe (second pipe) 4 and the dispenser 11 may be returned (recovered) to the tank 12. Therefore, the imprint material 8 returned to the tank 12 is supplied to the supply pipe 4 and the dispenser 11 again once the maintenance of the imprint apparatus 100 is completed. Consequently, the pressure fluctuation occurs inside the tank 12 as the liquid surface of the imprint material 8 stored in the tank 12 lowers. In this case as well, the gas absorbed inside the tank 12 is the clean dry air supplied to the third space SP3, making it possible to reduce the entry of the contaminant from outside the tank 12 and prevent or reduce the contamination of the imprint material 8 stored in the tank 12.

Figure 2:
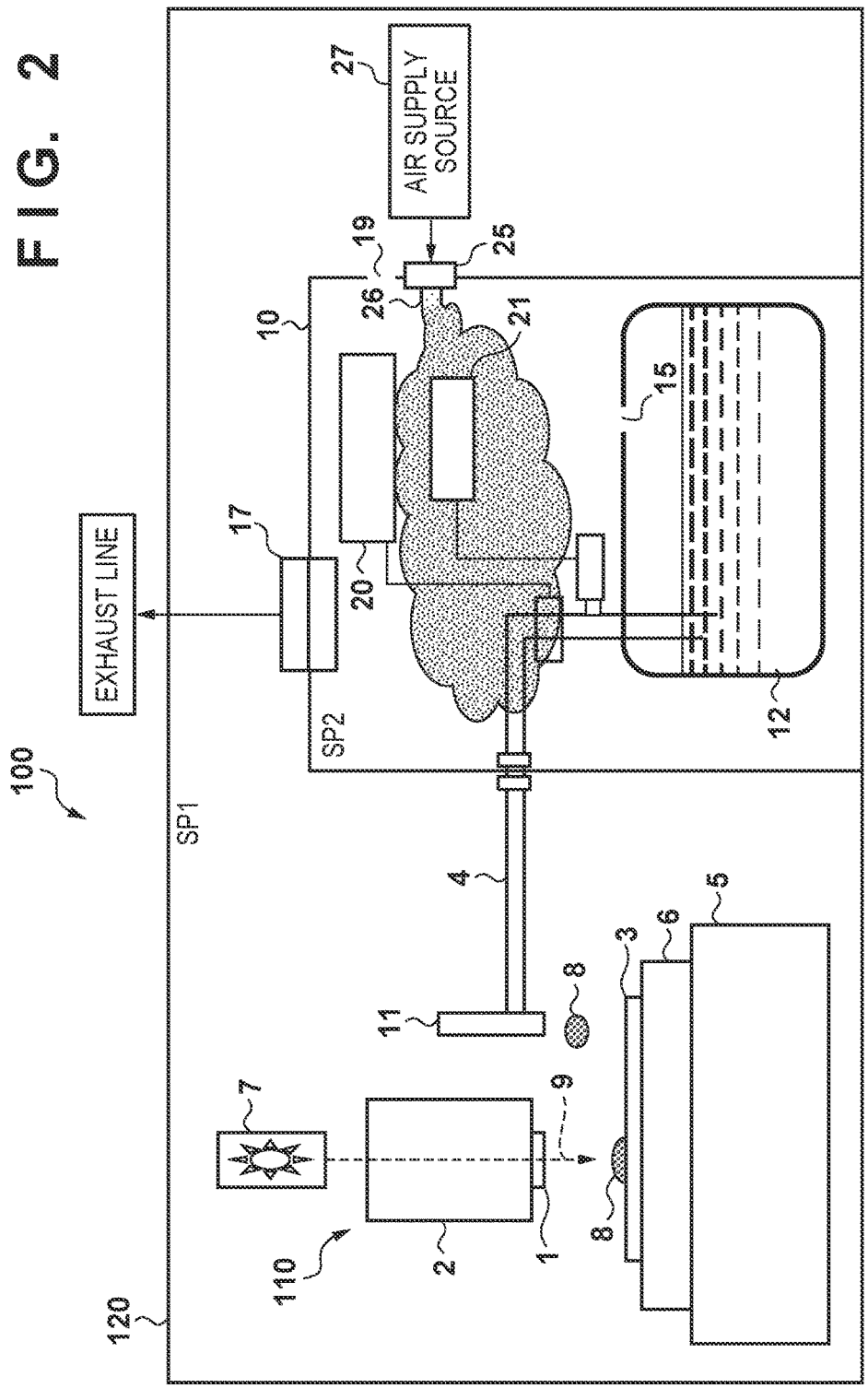
FIG. 2 is a schematic view showing the arrangement of an imprint apparatus according to another aspect of the present invention.

From the viewpoint of preventing or reducing the contamination of the imprint material 8 stored in the tank 12, the cover member 13 is not a constituent element always needed for the imprint apparatus 100, as shown in FIG. 2. In FIG. 2, the chamber 120 accommodates the enclosure 10, and the clean dry air from the air supply source 27 is supplied to the second space SP2 via the supply port 25 of the enclosure 10. Note that the introduction pipe 26 is preferably arranged such that the clean dry air is supplied to the proximity of the first opening 15 of the tank 12. As described above, in order to cope with the pressure fluctuation inside the tank 12, for example, the flow rate of the clean dry air supplied from the air supply source 27 needs to be adjusted such that the pressure of the second space SP2 becomes higher than the pressure inside the tank 12.

In the imprint apparatus 100 shown in FIG. 2, when the liquid surface of the imprint material 8 stored in the tank 12 changes, causing the pressure fluctuation inside the tank 12, the gas in the second space SP2 is absorbed inside the tank 12 via the first opening 15 of the tank 12. Note that the gas absorbed inside the tank 12 is the clean dry air supplied to the second space SP2 because the clean dry air is supplied from the air supply source 27 to the second space SP2 as described above. Therefore, the clean dry air enters inside the tank 12 even if the pressure fluctuation occurs inside the tank 12. This makes it possible to reduce the entry of the contaminant from outside the tank 12 and prevent or reduce the contamination of the imprint material 8 stored in the tank 12.

The gas supplied via the supply port 25 of the enclosure 10 is not limited to clean dry air, but may be a gas used for another purpose in the imprint apparatus 100. In that case, however, a contaminant contained in the gas needs to be removed, and thus, for example, a filter is arranged in the supply port 25 of the enclosure 10. As for the filter, a filter is used which removes moisture, particles, the organic material, the inorganic material, and various gases. The number and type of filters are decided in accordance with a gas to be used and the type of imprint material 8.

Depending on the type of imprint material 8 used in the imprint apparatus 100, an oxygen inhibition may be caused in a curing step. Therefore, a step of removing oxygen from a space including the imprint material 8 in the curing step may become necessary. In this case, the imprint material 8 may be caused to contain a predetermined amount of oxygen in order to prevent the imprint material 8 from being cured accidentally. If the gas supplied to the second space SP2 and the third space SP3 does not contain oxygen, oxygen may be separated from the imprint material 8 depending on a component of that gas. Therefore, the gas supplied to the second space SP2 and the third space SP3 may be caused to contain oxygen.

According to the imprint apparatus 100 of this embodiment, the entry of a contaminant such as a foreign substance or metal ions into the imprint material 8 stored in the tank 12 can be reduced, making it possible to supply the imprint material 8 stably and ensure a yield.

As described above, in an embodiment shown in FIG. 1, the gas supplied from the air supply source 27 to the third space SP3 (the gas caused to pass through the opening 15) is cleaner than the gas supplied to the first space SP1 and the second space SP2. In an embodiment shown in FIG. 2, the gas supplied to the second space SP2 (the gas caused to pass through the opening 15) is cleaner than the gas supplied to the first space SP1.

These differences in cleanness may be implemented by a difference in level of cleanliness of the gas supplied to the filter through which the gas passes before being supplied to each space of the first space SP1 and second space SP2. These differences may be implemented by, for example, the use/nonuse of the clean dry air or a difference in amount per unit volume of the organic gas and the inorganic material ($NH_4$, $SO_x$, or the like) in the gas supplied to the filter.

Alternatively, the differences in cleanness may be implemented by a difference in performance of the filter through which the gas passes before being supplied to each space. For example, the gas caused to pass through the opening 15 has passed through a filter having high collection efficiency of small particles (for example, a particle of 10 nm or less). For example, the gas caused to pass through the opening 15 has passed through a filter having high collection efficiency (for example, the collection efficiency of 99% or more) of the metal ions (Na ions, Fe ions, Cu ions, or the like). For example, while the gas supplied to the first space SP1 does not use a hydrous filter which reduces moisture, the gas caused to pass through the opening 15 has passed through the hydrous filter. The gas caused to pass through the opening 15 may have passed through at least two aforementioned filters.

The entry of the contaminant such as the foreign substance or the metal ions into the imprint material 8 stored in the tank 12 can be reduced, making it possible to supply the imprint material 8 stably, reduce a defect in the pattern of the imprint material 8, and ensure the yield of articles manufactured by using the imprint apparatus.

(Method of Manufacturing Article)

A pattern of a cured product formed by using an imprint apparatus is used permanently for at least some of various articles or used temporarily when the various articles are manufactured. The article includes an electric circuit element, an optical element, a MEMS, a printing element, a sensor, a mold, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The mold includes, for example, an imprinting mold.

The pattern of the cured product is used without any change as a constituent member of at least some of the above-described articles or used temporarily as a resist mask. The resist mask is removed after etching, ion implantation, or the like is performed in a processing step of the substrate.

Figure 3A:
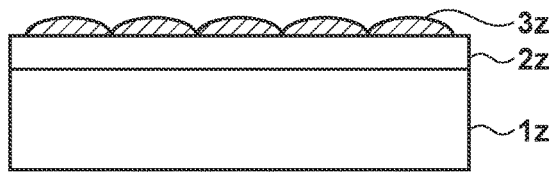
FIGS. 3A to 3F are views for explaining a method of manufacturing an article.

A detailed method of manufacturing the article will now be described. As shown in FIG. 3A, a substrate 1z such as a silicon wafer having a processing target material 2z such as an insulator formed on its surface is prepared, and then an imprint material 3z is given on the surface of the processing target material 2z by an inkjet method or the like. A state is shown here in which the imprint material 3z formed into a plurality of droplets is given on the substrate 1z.

Figure 3B:
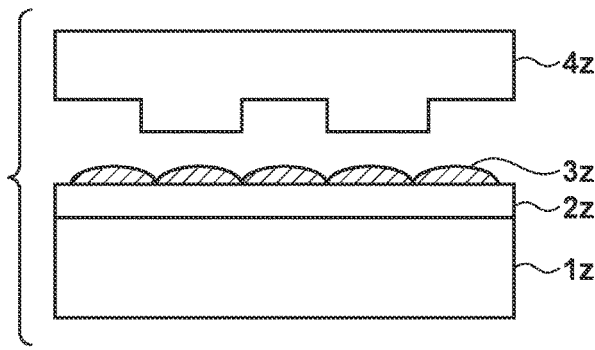
Figure 3C:
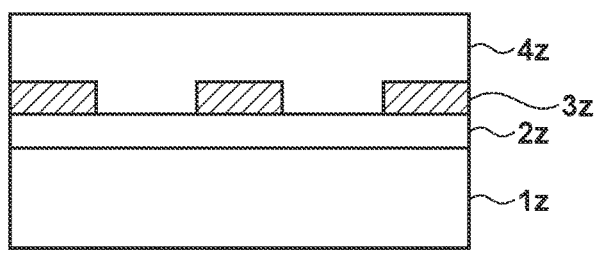

As shown in FIG. 3B, a side of an imprinting mold 4 on which its three-dimensional pattern is formed faces the imprint material 3z on the substrate 1z. As shown in FIG. 3C, a mold 4z and the substrate 1z to which the imprint material 3z is given are brought into contact with each other, and a pressure is applied. The imprint material 3z fills the gap between the mold 4z and the processing target material 2z. The imprint material 3z is cured by irradiating it with light as curing energy through the mold 4z in this state.

Figure 3D:
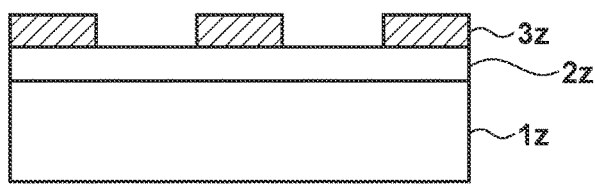

As shown in FIG. 3D, the pattern of the cured product of the imprint material 3z is formed on the substrate 1z by releasing the mold 4z and the substrate 1z from each other after curing the imprint material 3z. The pattern of this cured product has a shape with the convex portion of the cured product corresponding to the concave portion of the mold and the concave portion of the cured product corresponding to the convex portion of the mold. That is, the three-dimensional pattern of the mold 4z is transferred to the imprint material 3z.

Figure 3E:
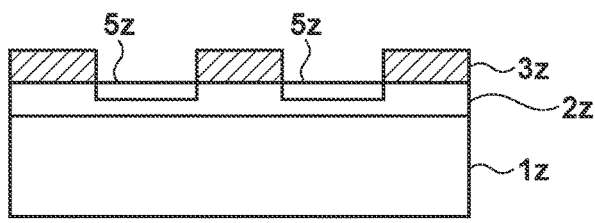
Figure 3F:
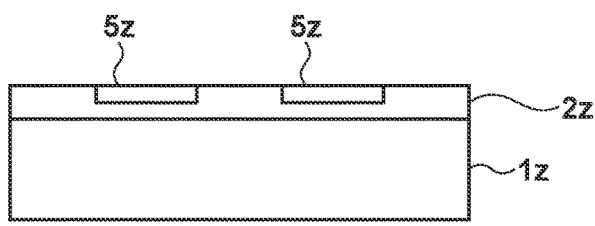

As shown in FIG. 3E, out of the surface of the processing target material 2z, portions without the cured product or portions where the cured products remain thin are removed and become trenches 5z by performing etching using the pattern of the cured product as an etching resistant mask. As shown in FIG. 3F, an article having the trenches 5z formed on the surface of the processing target material 2z can be obtained by removing the pattern of the cured product. The pattern of the cured product is removed here. However, the pattern of the cured product may be utilized as, for example, an interlayer dielectric film included in the semiconductor element or the like, that is, the constituent member of the article without removing it after processing.

The present invention is not limited to the imprint apparatus. The present invention is also applicable to an apparatus which includes a dispenser discharging a liquid, for example, industrial apparatuses such as a semiconductor manufacturing apparatus and liquid crystal manufacturing apparatus, and consumer products such as a printer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-174017 filed on Sep. 3, 2015, which is hereby incorporated by reference herein in its entirety.

What is claimed is:

1. An imprint apparatus comprising:
a chamber configured to define a first space including a processing unit which includes a discharge unit configured to discharge an imprint material onto a substrate and is configured to perform an imprint process of forming a pattern of the imprint material on the substrate by using a mold, the first space containing a gas having a predetermined level of cleanliness; and
an enclosure configured to define a second space including a tank configured to store the imprint material supplied to the discharge unit,
wherein a gas that is cleaner than the gas that is contained in the first space is supplied to the second space so that a pressure of the second space becomes higher than a pressure inside the tank,
the tank has a first opening open to the second space, and
the enclosure has a supply port configured to supply the gas that is cleaner than the gas in the first space, to the second space, and
the gas supplied to the second space is absorbed from the first opening to the inside of the tank in response to a change in pressure inside the tank.

2. The apparatus according to claim 1, wherein the enclosure has an exhaust port configured to exhaust the gas in the second space to a space outside the first space and the second space.

3. The apparatus according to claim 1, further comprising
a cover member provided on the tank and configured to define a third space separated from the second space and connecting with the tank through the first opening, and
a first pipe having one end connected to the supply port and configured to introduce the clean gas,
wherein the cover member has a connection port connected to the other end of the first pipe and a second opening open to the second space, and
the gas that is cleaner than the gas in the first space is supplied to the third space via the first pipe, and the clean gas supplied to the third space is exhausted to the second space via the second opening.

4. The apparatus according to claim 3, wherein a bore of the connection port and a bore of the second opening are set such that a pressure of the third space becomes higher than a pressure above the imprint material inside the tank.

5. The apparatus according to claim 1, further comprising
a second pipe configured to connect the discharge unit and the tank, and
a circulation unit configured to circulate the imprint material via the second pipe between the discharge unit and the tank.

6. The apparatus according to claim 5, further comprising a pressure control unit configured to maintain a pressure inside the second pipe at a negative pressure with respect to an atmospheric pressure.

7. The apparatus according to claim 5, further comprising an adjustment unit configured to adjust a temperature of the imprint material which circulates between the discharge unit and the tank.

8. The apparatus according to claim 1, wherein the enclosure has an intake port configured to take an external gas in the second space.

9. A supply apparatus that is used in an imprint apparatus that includes a chamber configured to define a first space containing a gas having a predetermined level of cleanliness and including a processing unit which includes a discharge unit configured to discharge an imprint material onto a substrate and is configured to perform an imprint process of forming a pattern of the imprint material on the substrate by using a mold, and supplies the imprint material to the discharge unit, the apparatus comprising:
a tank configured to store the imprint material supplied to the discharge unit; and
an enclosure configured to define a second space including the tank,
wherein a gas cleaner than the gas in the first space is supplied to the second space so that a pressure of the second space becomes higher than a pressure inside the tank,
the tank has a first opening open to the second space,
the enclosure has a supply port configured to supply, to the second space via the first opening, the gas cleaner than the gas supplied to the first space, and
the gas supplied to the second space is absorbed from the first opening to the inside of the tank in response to a change in pressure inside the tank,
wherein the supply apparatus further comprises
a cover member provided in the tank and configured to define a third space separated from the second space while covering the first opening, and
a first pipe having one end connected to the supply port and configured to introduce the gas cleaner than the gas in the first space,
the cover member has a connection port connected to the other end of the first pipe and a second opening open to the second space, and
the air gas cleaner than the gas in the first space is supplied to the third space via the first pipe, and the gas supplied to the third space is exhausted to the second space via the second opening.

* * * * *